(12) United States Patent
Hu et al.

(10) Patent No.: US 6,841,414 B1
(45) Date of Patent: Jan. 11, 2005

(54) SAW AND ETCH SINGULATION METHOD FOR A CHIP PACKAGE

(75) Inventors: Tom Hu, Gilbert, AZ (US); Terry W. Davis, Gilbert, AZ (US); Ludovico E. Bancod, Chandler, AZ (US); Won Dai Shin, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 268 days.

(21) Appl. No.: 10/174,603

(22) Filed: Jun. 19, 2002

(51) Int. Cl.[7] .............................................. H01L 21/44
(52) U.S. Cl. ........................ 438/106; 438/112; 438/113
(58) Field of Search ................................ 438/106, 110, 438/111, 112, 113, 123, 124, 460, 461, 462

(56) References Cited

U.S. PATENT DOCUMENTS

| | | | |
|---|---|---|---|
| 3,838,984 A | 10/1974 | Crane et al. |
| 4,054,238 A | 10/1977 | Lloyd et al. |
| 4,530,152 A | 7/1985 | Roche et al. |
| 4,707,724 A | 11/1987 | Suzuki et al. |
| 4,756,080 A | 7/1988 | Thorp, Jr. et al. |
| 4,812,896 A | 3/1989 | Rothgery et al. |
| 4,907,067 A | 3/1990 | Derryberry |
| 5,029,386 A | 7/1991 | Chao et al. |
| 5,041,902 A | 8/1991 | McShane |
| 5,087,961 A | 2/1992 | Long et al. |
| 5,157,480 A | 10/1992 | McShane et al. |
| 5,172,213 A | 12/1992 | Zimmerman |
| 5,172,214 A | 12/1992 | Casto |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,221,642 A | 6/1993 | Burns |

(List continued on next page.)

FOREIGN PATENT DOCUMENTS

| | | |
|---|---|---|
| DE | 19734794 A1 | 8/1997 |
| EP | 0794572 A2 | 10/1997 |
| JP | 5745959 | 3/1982 |
| JP | 59208756 | 11/1984 |
| JP | 59227143 | 12/1984 |
| JP | 60195957 | 10/1985 |
| JP | 60231349 | 11/1985 |
| JP | 6139555 | 2/1986 |
| JP | 629639 | 1/1987 |
| JP | 63205935 | 8/1988 |
| JP | 63233555 | 9/1988 |
| JP | 1106456 | 4/1989 |
| JP | 6092076 | 4/1994 |
| JP | 7312405 | 11/1995 |
| JP | 8125066 | 5/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| KR | 941979 | 1/1994 |
| KR | 9772358 | 11/1997 |

*Primary Examiner*—Tuan H. Nguyen
(74) *Attorney, Agent, or Firm*—Stetina Brunda Garred & Brucker

(57) ABSTRACT

A method of fabricating semiconductor packages from a lead frame strip which includes a mold cap applied to one side thereof, and defines a multiplicity of lead frames integrally connected to each other by connecting bars which extend in multiple rows and columns and define saw streets. In the singulation method of the present invention, the mold cap is sawed along the saw streets to expose the connecting bars. Thereafter, the connecting bars are chemically etched to separate the lead frames from each other.

16 Claims, 5 Drawing Sheets

U.S. PATENT DOCUMENTS

| | | | |
|---|---|---|---|
| 5,258,094 | A | 11/1993 | Furui et al. |
| 5,273,938 | A | 12/1993 | Lin et al. |
| 5,277,972 | A | 1/1994 | Sakumoto et al. |
| 5,278,446 | A | 1/1994 | Nagaraj et al. |
| 5,279,029 | A | 1/1994 | Burns |
| 5,294,897 | A | 3/1994 | Notani et al. |
| 5,332,864 | A | 7/1994 | Liang et al. |
| 5,336,931 | A | 8/1994 | Juskey et al. |
| 5,343,076 | A | 8/1994 | Katayama et al. |
| 5,406,124 | A | 4/1995 | Morita et al. |
| 5,410,180 | A | 4/1995 | Fujii et al. |
| 5,424,576 | A | 6/1995 | Djennas et al. |
| 5,428,248 | A | 6/1995 | Cha |
| 5,435,057 | A | 7/1995 | Bindra et al. |
| 5,474,958 | A | 12/1995 | Djennas et al. |
| 5,521,429 | A | 5/1996 | Aono et al. |
| 5,581,122 | A | 12/1996 | Chao et al. |
| 5,604,376 | A | 2/1997 | Hamburgen et al. |
| 5,608,267 | A | 3/1997 | Mahulikar et al. |
| 5,625,222 | A | 4/1997 | Yoneda et al. |
| 5,639,990 | A | 6/1997 | Nishihara et al. |
| 5,640,047 | A | 6/1997 | Nakashima |
| 5,641,997 | A | 6/1997 | Ohta et al. |
| 5,646,831 | A | 7/1997 | Manteghi |
| 5,650,663 | A | 7/1997 | Parthasarathi |
| 5,683,806 | A | 11/1997 | Sakumoto et al. |
| 5,696,666 | A | 12/1997 | Miles et al. |
| 5,701,034 | A | 12/1997 | Marrs |
| 5,710,064 | A | 1/1998 | Song et al. |
| 5,736,432 | A | 4/1998 | Mackessy |
| 5,776,798 | A | 7/1998 | Quan et al. |
| 5,783,861 | A | 7/1998 | Son |
| 5,835,988 | A | 11/1998 | Ishii |
| 5,844,306 | A | 12/1998 | Fujita et al. |
| 5,859,471 | A | 1/1999 | Kuraishi et al. |
| 5,866,939 | A | 2/1999 | Shin et al. |
| 5,877,043 | A | 3/1999 | Alcoe et al. |
| 5,886,398 | A | 3/1999 | Low et al. |
| 5,894,108 | A | 4/1999 | Mostafazadeh et al. |
| 5,942,794 | A | 8/1999 | Okumura et al. |
| 5,959,356 | A | 9/1999 | Oh |
| 5,973,388 | A | 10/1999 | Chew et al. |
| 5,977,613 | A | 11/1999 | Takata et al. |
| 5,977,615 | A | 11/1999 | Yamaguchi et al. |
| 5,977,630 | A | 11/1999 | Woodworth et al. |
| 5,981,314 | A | 11/1999 | Glenn et al. |
| 5,986,885 | A | 11/1999 | Wyland |
| 6,001,671 | A | 12/1999 | Fjelstad |
| 6,025,640 | A | 2/2000 | Yagi et al. |
| 6,034,423 | A | 3/2000 | Mostafazadeh et al. |
| 6,072,228 | A | 6/2000 | Hinkle et al. |
| 6,130,115 | A | 10/2000 | Okumura et al. |
| 6,130,473 | A | 10/2000 | Mostafazadeh et al. |
| 6,140,154 | A | 10/2000 | Hinkle et al. |
| 6,143,981 | A | 11/2000 | Glenn |
| 6,184,465 | B1 | 2/2001 | Corisis |
| 6,198,171 | B1 | 3/2001 | Huang et al. |
| 6,225,146 | B1 | 5/2001 | Yamaguchi et al. |
| 6,229,200 | B1 | 5/2001 | Mclellan et al. |
| 6,242,281 | B1 | 6/2001 | Mclellan et al. |
| 6,281,566 | B1 | 8/2001 | Magni |
| 6,281,568 | B1 | 8/2001 | Glenn et al. |
| 6,294,100 | B1 | 9/2001 | Fan et al. |
| 6,384,472 | B1 | 5/2002 | Huang |
| 6,399,415 | B1 * | 6/2002 | Bayan et al. ............... 438/106 |
| 6,468,832 | B1 * | 10/2002 | Mostafazadeh ............ 438/112 |
| 6,489,218 | B1 | 12/2002 | Kim et al. |
| 2001/0040276 | A1 * | 11/2001 | Yasunaga et al. ........... 257/670 |
| 2002/0197826 | A1 * | 12/2002 | Kim ........................... 438/460 |

* cited by examiner

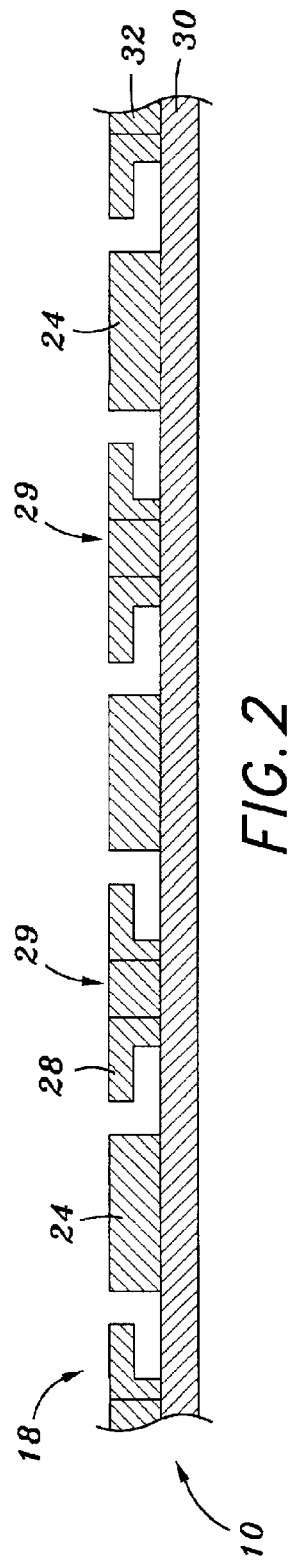
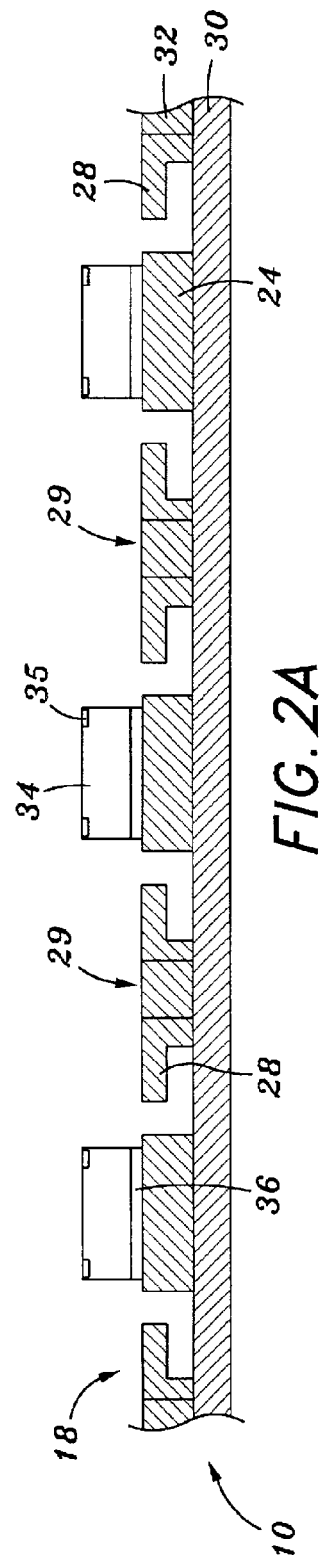
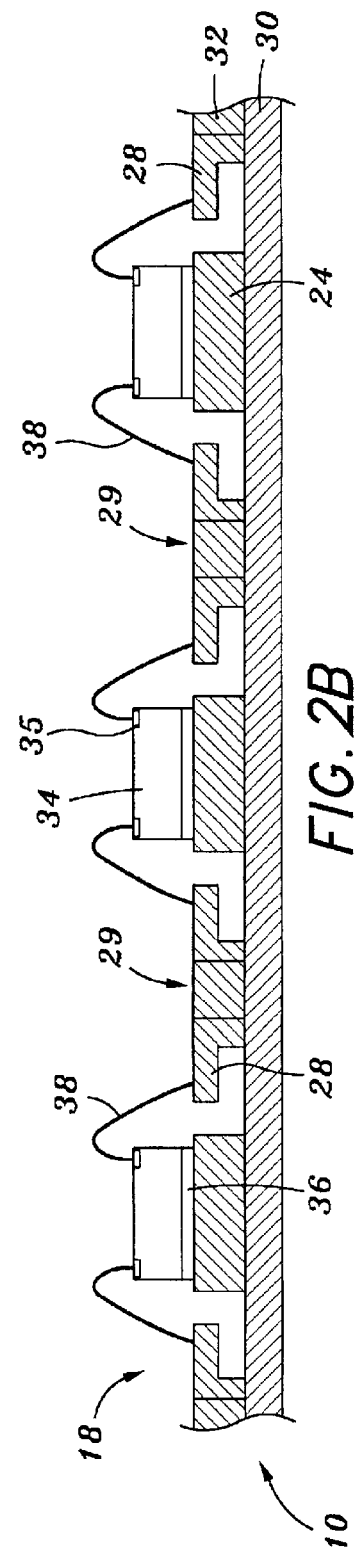

SAW AND ETCH SINGULATION METHOD FOR A CHIP PACKAGE

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to integrated circuit chip package technology, and more particularly to a unique manufacturing methodology for a micro lead frame (MLF) package adapted to improve the longevity of and feed rate for the cutting blades used in a saw singulation process employed during the manufacture of the chip package, and to eliminate the quality reducing sawing burrs which are normally created as a result of the saw singulation process.

Integrated circuit dies are conventionally enclosed in plastic packages that provide protection from hostile environments and enable electrical interconnection between the integrated circuit die and an underlying substrate such as a printed circuit board (PCB). The elements of such a package include a metal lead frame, an integrated circuit die, bonding material to attach the integrated circuit die to the lead frame, bond wires which electrically connect pads on the integrated circuit die to individual leads of the lead frame, and a hard plastic encapsulant material which covers the other components and forms the exterior of the package.

The lead frame is the central supporting structure of such a package. A portion of the lead frame is internal to the package, i.e., completely surrounded by the plastic encapsulant. Portions of the leads of the lead frame extend externally from the package or are partially exposed within the encapsulant material for use in electrically connecting the chip package to another component. In certain chip packages, a portion of the die pad of the lead frame also remains exposed within the exterior of the package for use as a heat sink.

For purposes of high-volume, low-cost production of chip packages, a current industry practice is to etch or stamp a thin sheet of metal material to form a panel or strip which defines multiple lead frames. A single strip may be formed to include multiple arrays, with each such array including a multiplicity of lead frames in a particular pattern. In a typical chip package manufacturing process, the integrated circuit dies are mounted and wire bonded to respective ones of the lead frames, with the encapsulant material then being applied to the strip so as to encapsulate the integrated circuit dies, bond wires, and portions of each of the lead frames in the above-described manner. The hardening of the encapsulant material facilitates the formation of a mold cap upon the lead frames.

Upon the hardening of the encapsulant material, the lead frames within the strip are cut apart or singulated for purposes of producing the individual chip packages. Such singulation is typically accomplished via a saw singulation process. In this process, a saw blade is advanced along "saw streets" which extend in prescribed patterns between the lead frames as required to facilitate the separation of the lead frames from each other in the required manner. The advancement of the saw blade along the saw streets concurrently cuts the molded plastic mold cap, thus facilitating the formation of a molded plastic package body upon each of the separated lead frames.

One of the drawbacks associated with the saw singulation process used in relation to the manufacture of chip packages is that the saw blade used in the saw singulation process cuts through copper (i.e., the metal material typically used to fabricate the strip) one hundred percent of the time. As will be recognized, this level of sawing through copper as occurs as a result of the configuration of the strip often results in the premature wear of the costly saw singulation blades. Another drawback of the saw singulation process is that the same also typically results in the burring of the leads of the separated lead frames. Saw generated burrs at the seating plan of each lead in the lead frame adversely affect solder mounting and joint reliability. In current chip package fabrication methodologies, lead burrs are controlled by limiting the feed rate of the saw blade along the saw streets and by using specifically developed, high cost saw blades. However, as will be recognized, the use of the high cost saw blades is undesirable due to the resultant increase in production costs, with the reduced feed rates needed to control burring adversely affecting production speed, and thus efficiency.

The present invention addresses these drawbacks by providing a unique manufacturing methodology for a chip package wherein the singulation process employed in the manufacturing methodology resolves the issues of slow sawing speed, blade wear and sawing burrs on the leads. In this regard, the singulation process is accomplished in the present invention in a two-step process wherein the saw blade is used to cut only the plastic mold cap applied to the lead frames, with an etching technique being employed to facilitate the separation of the copper lead frames from each other. Since the saw blade is sawing only through the molded plastic of the mold cap, the sawing speed can be set to six inches per second or greater, which represents a substantial increase of the sawing speed of about 0.5 inches per second which is used when the saw blade concurrently cuts through the mold cap and lead frame strip. The sawing of only the mold cap further reduces blade wear of the saw blade, with the etching process used to separate the lead frames from each other leaving no burr on the leads of each lead frame. Thus, the present methodology provides significant cost benefits, and eliminates many of the drawbacks of current saw singulation processes which are often deemed to represent a significant bottleneck in chip package manufacturing methodologies. These, and other advantages of the present invention, will be discussed in more detail below.

BRIEF SUMMARY OF THE INVENTION

In accordance with a first embodiment of the present invention, there is provided a method of fabricating semiconductor packages from a lead frame strip which includes a mold cap applied to one side or face thereof, and defines a multiplicity of lead frames integrally connected to each other by connecting bars which extend in multiple rows and columns and define saw streets. In the singulation method of the first embodiment of the present invention, the plastic mold cap, and not the metallic lead frame, is sawed along the saw streets to expose the connecting bars. Thereafter, the connecting bars are chemically etched to separate the lead frames from each other.

Since the saw blade is sawing only through the molded plastic of the mold cap, the sawing speed can be set to six inches per second or greater, which represents a substantial increase of the sawing speed of about 0.5 inches per second common to conventional saw singulation techniques wherein the saw blade concurrently cuts through the mold cap and the lead frame strip. The sawing of only the mold cap further reduces blade wear of the saw blade, with the etching process used to separate the lead frames from each other leaving no burrs on the leads of each lead frame.

In accordance with a second embodiment of the present invention, the leadframe strip includes a plurality of package bodies formed on one side or face thereof, with the connecting bars being exposed between the package bodies. In the singulation method of the second embodiment of the present invention, the connecting bars are chemically etched to separate the leadframes from each other.

BRIEF DESCRIPTION OF THE DRAWINGS

These, as well as other features of the present invention, will become more apparent upon reference to the drawings wherein:

FIG. 2 is a cross-sectional view of the leadframe strip shown in FIG. 1, illustrating the insulating first layer and the metallic second layer thereof;

FIG. 2A is a cross-sectional view illustrating the step of attaching integrated circuit dies to the die pads of the leadframe strip shown in FIG. 2;

FIG. 2B is a cross-sectional view illustrating the step of electrically connecting each of the dies to the leads of the corresponding leadframe in the leadframe strip;

Common reference numerals are used throughout the drawings and detailed description to indicate like elements.

DETAILED DESCRIPTION OF THE INVENTION

Figure 1:
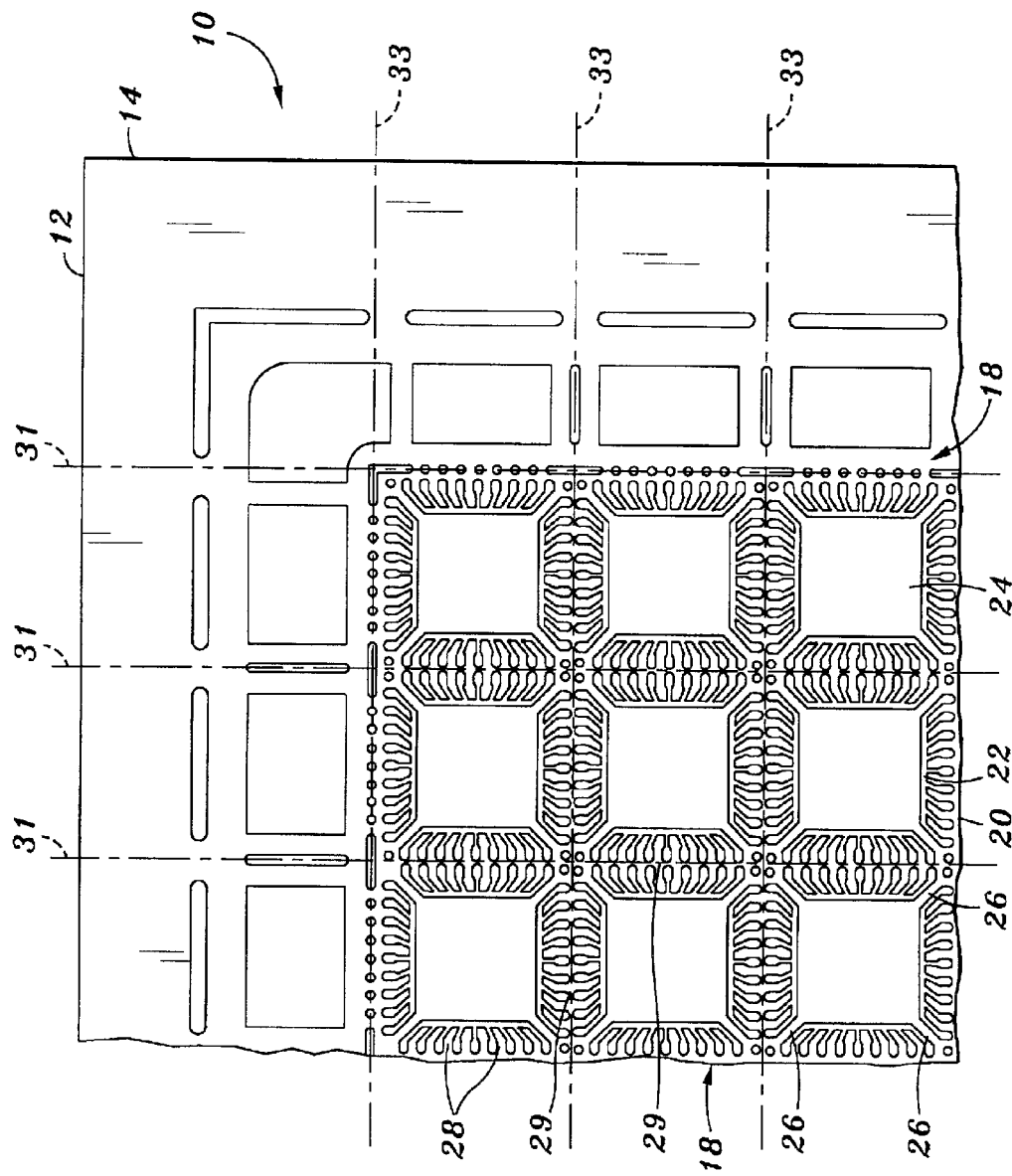
FIG. 1 is a partial top plan view of a lead frame strip defining multiple lead frames.

Referring now to the drawings wherein the showings are for purposes of illustrating preferred embodiments of the present invention only, and not for purposes of limiting the same, FIG. 1 depicts a portion of a lead frame strip 10. The strip 10 typically has a generally rectangular configuration, defining an opposed pair of longitudinal peripheral edge segments 12 and an opposed pair of lateral peripheral edge segments 14. The strip 10 defines multiple identically configured arrays, with each array defining a multiplicity of lead frames 18.

As seen in FIGS. 1 and 2, each lead frame 18 comprises an outer frame portion 20 which defines a centrally positioned opening 22. Disposed within the opening 22 is a die pad 24 of the lead frame 18. The die pad 24 is a substantially square plate which is connected to the outer frame portion 20 by a plurality of tie bars 26 of the lead frame 18. Four tie bars 26 are typically used to connect the die pad 24 to the outer frame portion 20, with the tie bars 26 extending from respective ones of the four corner regions defined by the die pad 24. The tie bars 26 facilitate the stable support of the die pad 24 inside the outer frame portion 20, and more particularly within the opening 22 defined thereby. The opening 22 itself has a generally square or rectangular configuration, as does the outer frame portion 20.

Each lead frame 18 further comprises a multiplicity of leads 28 which are integrally connected to the outer frame portion 20 and protrude therefrom into the opening 22 toward the peripheral edge of the die pad 24. The leads 28 are segregated into four sets, with each set being disposed in spaced relation to a respective one of the four peripheral edge segments defined by the die pad 24. The leads 28 of each set are typically equidistantly spaced from each other, with narrow gaps of equal width being defined therebetween. As indicated above, the free distal ends of the leads 28 are disposed in spaced relation to the peripheral edge of the die pad 24.

Figure 4:
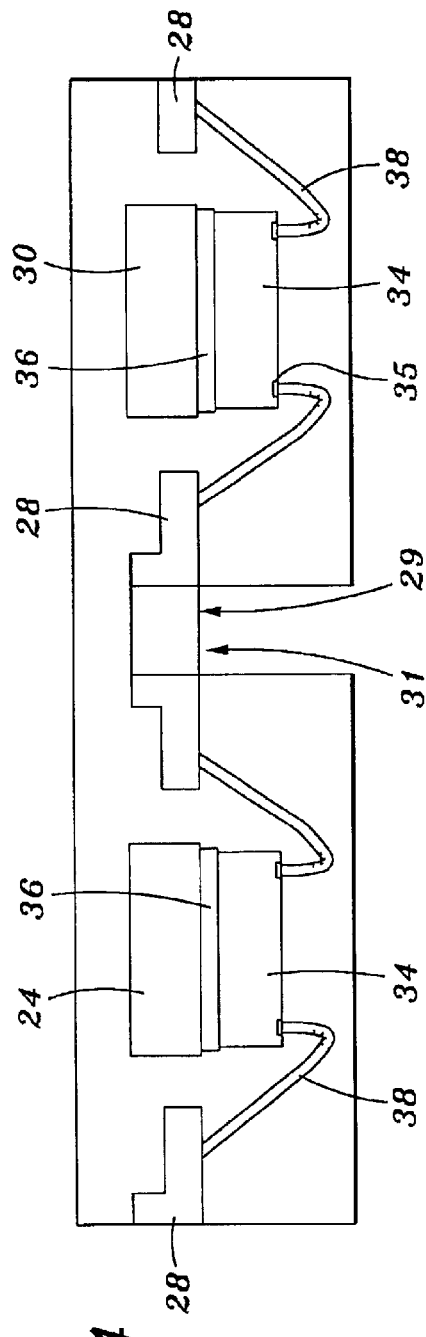
FIG. 4 is a cross-sectional view of the lead frame strip and mold cap shown in FIG. 3.

The lead frame 18 is not always fabricated to be of uniform thickness. In this regard, regions of the die pad 24 and/or leads 28 may be formed to have a thinner thickness than that of the remainder of the lead frame 18. As shown in FIG. 4, each of the leads 28 is formed to include a region of reduced thickness at the distal end thereof. Though not shown, the die pad 24 may be formed in a manner wherein a recessed shelf ex-ends about the periphery of the bottom surface thereof. Those of ordinary skill in the art will recognize that the configuration of the lead frame 18 is exemplary only, and that the singulation methodology of the present invention as will be discussed in more detail below may be used with lead frames formed to be of uniform thickness, with differing numbers of leads 28 in differing patterns, differing numbers of tie bars 26 or no tie bars at all, and/or a differently configured die pad 24.

As indicated above, each array of the strip 10 defines a multiplicity of lead frames 18. In each array, the outer frame portions 20 of the lead frames 18 are integrally connected to each other such that the lead frames 18 are arranged in a matrix wherein the outer frame portions 20 thereof collectively define connecting bars 29 which extend in multiple rows and columns. Certain ones of the connecting bars 29 define lateral saw streets 31 which extend perpendicularly between the longitudinal peripheral edge segments 12 of the strip 10, with certain ones of the connecting bars 29 defining longitudinal saw streets 33 which extend perpendicularly between the lateral peripheral edge segments 14 of the strip 10. The lateral saw streets 31 are defined by respective columns of the connecting bars 29, with the longitudinal saw streets 33 being defined by respective rows of the connecting bars 29.

As best seen in FIGS. 2–5, the strip 10 preferably comprises a first layer 30 which is preferably formed from an insulating material, and may comprise a thermal tape fabricated from a polyimide. In addition to the first layer 30, the strip 10 comprises a second layer 32 which is formed from a conductive metallic material (e.g., copper) and defines the lead frames 18. The second layer 32 of the lead frame strip 10 is preferably formed by chemical etching, with the regions of the lead frames 18 of reduced thickness (if any) being formed through the implementation of a half-etch technique. The first layer 30 is applied to the second layer 32 such that the first layer 30 covers one side of each of the lead frames 18 within the lead frame strip 10. Prior to the application of the first layer 30 to the second layer 32, the face of the second layer 32 to which the first layer 30 is to be applied may be plated with layers such as Ni, Pd and the like, with the first layer 30 being applied to the second layer 32 upon the completion of such plating process.

Figure 6:
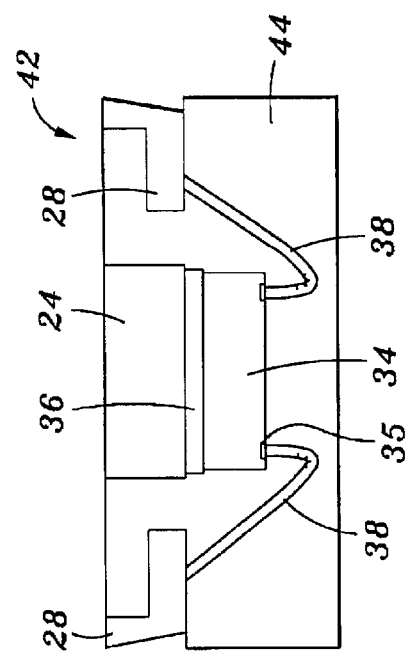
FIG. 6 is a cross-sectional view of a chip package formed through the use of the singulation method of the first embodiment of the present invention.

In fabricating chip packages via the implementation of the singulation methodology of the present invention, a multiplicity of integrated circuit dies 34 are disposed upon the top surfaces of respective ones of the die pads 24. The top surface of each die pad 24 is opposed to the bottom surface which contacts the first layer 30. The die 34 is bonded to the top surface of the corresponding die pad 24, with such bonding typically being accomplished through the use of an epoxy, an adhesive film 36 (as shown in FIGS. 4 and 6), or adhesive tape. Each integrated circuit die 34 includes a plurality of input-output pads 35 disposed on the surface thereof opposite that bonded to the top surface of the die pad 24. The input-output pads 35 of each die 34 are mechanically and electrically connected to respective ones of the leads 28 of the corresponding lead frame 18 through the use of conductive wires 38, such as gold, copper, or aluminum wires.

Figure 2C:
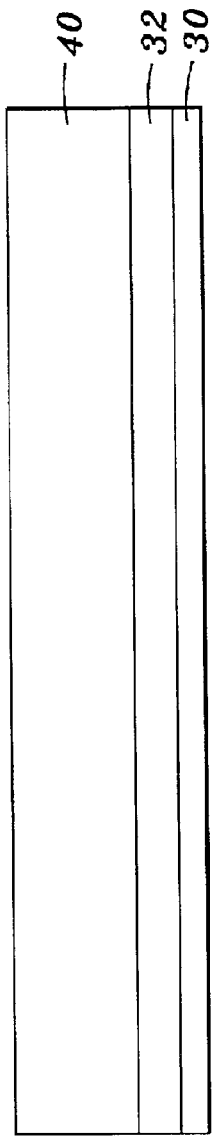
FIG. 2C is a side-elevational view of the lead frame strip shown in FIG. 1 having a mold cap formed thereon which encapsulates portions of the leads and die pads of the leadframes, the dies, and the wires used to electrically connect the dies to the leadframes.

Those portions of each lead frame 18 which are not in contact with the first layer 30, the dies 34 and conductive wires 38 are encapsulated or sealed with a sealing material, such as an epoxy or plastic molding compound. In accordance with a first embodiment of the present invention, the hardened sealing material defines a mold cap 40. As best seen in FIG. 2C, the mold cap 40 is a continuous structure which extends along the side or face of the second layer 32 opposite the side or face to which the first layer 30 is applied.

As indicated above, in conventional saw singulation techniques, the first and second layers 30, 32 and mold cap 40 would be simultaneously cut by the advancement of a saw blade along the saw streets 31, 33 to facilitate the separation of the lead frames 18 from each other and the formation of individual chip packages. As also explained above, the necessity of cutting through the copper second layer 32 in addition to the first layer 30 and mold cap 40 would require that the saw blades be advanced along the saw streets at a relatively slow sawing speed of about 0.5 inches per second. The cutting of the metallic second layer 32 would also give rise to blade wear in relation to the saw blades, and sawing burrs on the cut ends of the leads 28 exposed within the package body of each chip package. These sawing burrs adversely impact second level reliability (i.e., the integrity of the solder bond between the chip package and an underlying substrate such as a printed circuit board), with a typical requirement being that such saw burr be of a size of forty microns or less. The format-ion of saw burrs via the conventional saw singulation process often requires follow-up burr removal or push-down procedures.

Figure 3:
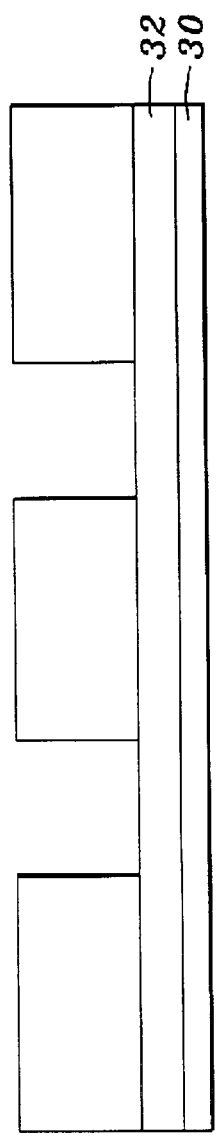
FIG. 3 is a side-elevational view of the lead frame strip and mold cap subsequent to the completion of the sawing step of the singulation method of a first embodiment of the present invention.
Figure 5:
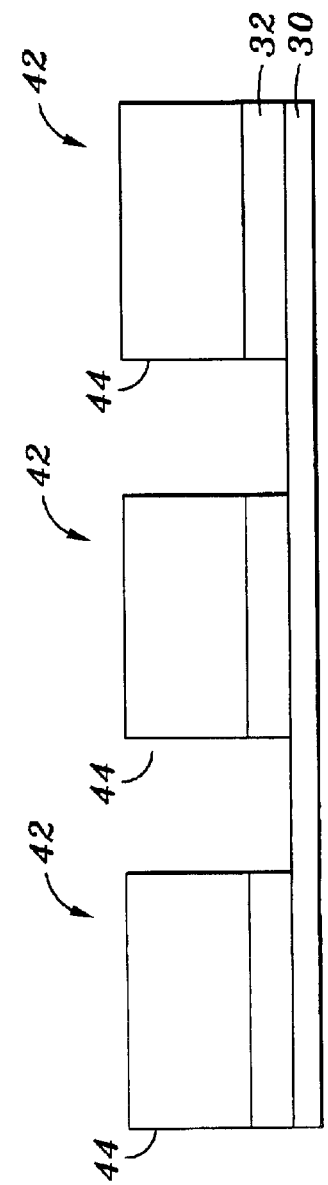
FIG. 5 is a side-elevational view of the lead frame strip and mold cap subsequent to the completion of the etching step of the singulation method of the first embodiment of the present invention.

In the singulation method of the present invention, the saw blade is used to cut only the plastic mold cap 40 along the lateral and longitudinal saw streets 31, 33 (FIGS. 3 and 4). Thus, neither the metallic second layer 32 nor the first layer 30 are cut by the saw blade. Since the saw blade is only cutting through the material of the mold cap 40, the sawing speed can be increased to eight inches per second or higher. Additionally, blade wear is substantially reduced since the saw blade cuts only through the material of the mold cap 40 (e.g., plastic), and not the metallic material (e.g., copper) of the second layer 32 defining the lead frames 18.

The sawing of the mold cap 40 in the above-described manner causes one side or face of each of the connecting bars 29 extending along the lateral and longitudinal saw streets 31, 33 to be exposed. In the singulation method of the present invention, the connecting bars 29 are chemically etched (FIG. 5) all the way to the first layer 30. Such etching facilitates the complete disconnection or separation of the lead frames 18 within each array in the strip 10 from each other. Upon the completion of the etching process, the removal of the first layer 30 from the resultant chip packages 42 completes the fabrication process. Each chip package 42 formed through the use of the saw and etch singulation method of the present invention includes a package body 44 which comprises the hardened encapsulant material and is defined by the cutting of the mold cap 40 along the lateral and longitudinal saw streets 31, 33.

Advantageously, the use of etching to separate the lead frames 18 from each other completely avoids the undesirable formation of sawing burrs which, as indicated above, occur as a result of the conventional saw singulation process. As seen in FIG. 6, the etching process also causes the resultant chip package 42 to have an etch "signature" which is characterized by the tapered or concave configuration of the outer ends of the leads 28 which are exposed within the side surface of the package body 44 of each chip package 42. Advantageously, the tapered or concave configuration of the exposed ends of the leads 28 facilitates the reflow or wicking of solder up the lead outer ends, thereby increasing the overall solder joint strength and reliability between the chip package 42 and an underlying substrate such as a printed circuit board or motherboard. The effective increases in solderable area of the leads 28 attributable to the tapered or concave configuration of the outer ends thereof thus results in increased second level reliability attributable to the final solder joint between the chip package 42 and the printed circuit board or other underlying substrate being stronger.

Figure 7:
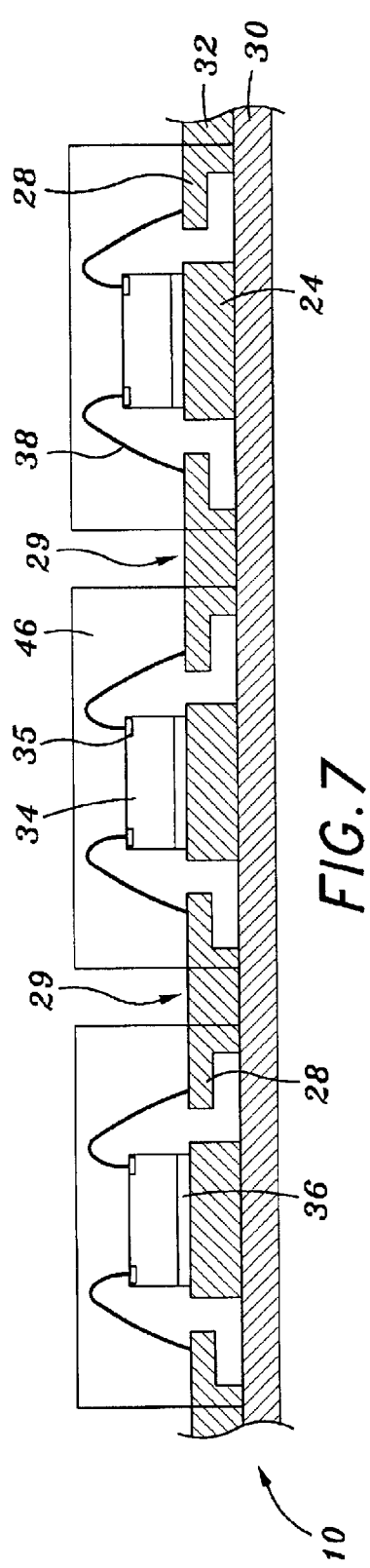
FIG. 7 is a cross-sectional view similar to FIG. 4, illustrating a pin gate molding step-used to form package bodies on the leadframes of the leadframe strip in accordance with a singulation method of a second embodiment of the present invention.
Figure 8:
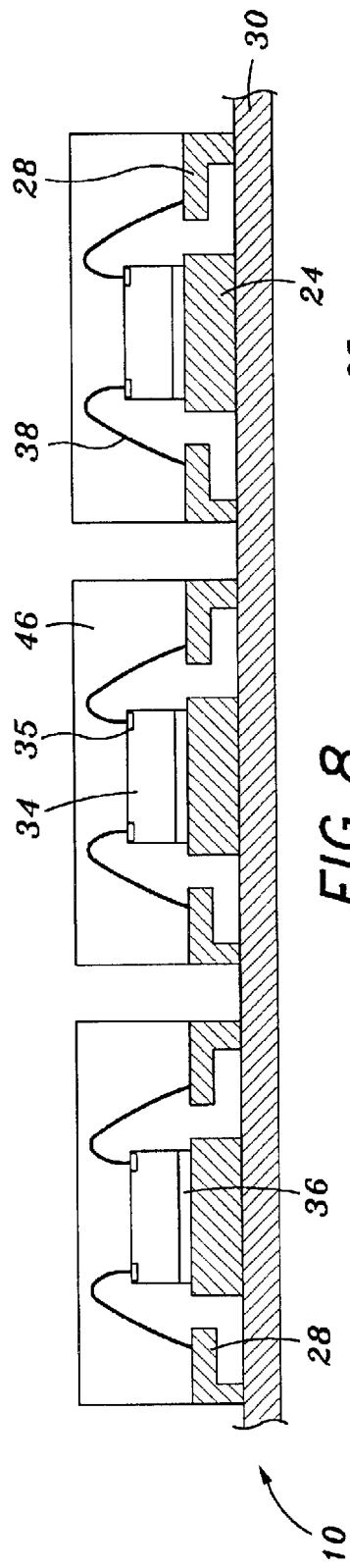
FIG. 8 is a cross-sectional view of the leadframe strip and package bodies shown in FIG. 7 subsequent to the completion of the etching step of the singulation method of the second embodiment of the present invention.
Figure 9:
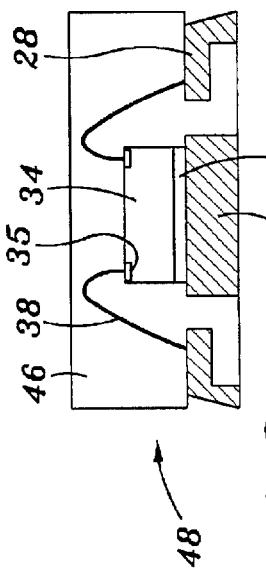
FIG. 9 is a cross-sectional view of a chip package formed through the use of the singulation method of the second embodiment of the present invention.

Referring now to FIGS. 7–9, in accordance with a second embodiment of the present invention, the above-described continuous mold cap 40 is not formed on the side of the second layer 32 opposite the side to which the first layer 30 is applied. Rather, portions of the die pad 24 and leads 28 of each lead frame 18 and the corresponding die 34 and wires 38 are encapsulated individually by a separate package body 46 through the use of a pin gate molding technique. In this regard, the pin gate molding technique is carried out such that only the die pad 24 and leads 28 of each leadframe 18 along with the corresponding die 34 and wires 33 are encapsulated, as opposed to the entire upper face or side of the second layer 32 of the leadframe strip 10 being covered with the encapsulant material. Thus, as is shown in FIG. 7, the connecting bars 29 are exposed between the formed package bodies 46 without the need to complete the mold cap sawing process described above in relation to the firs embodiment of the present invention.

Upon the formation of the package bodies 46, the exposed connecting bars 29 extending along the lateral and longitudinal saw streets 31, 33 are chemically etched (FIG. 8) all the way to the first layer 30 in the same manner previously described in relation to the first embodiment, with such etching facilitating the complete disconnection or separation of the leadframes 18 within each array in the strip 10 from each other. Upon the completion of the etching process, the removal of the first layer 30 from the resultant chip packages 48 (shown in FIG. 9) completes the fabrication process. The package body 46 of the chip package 48, like the mold cap 40 (and hence the package body 44 of the chip package 42) may be fabricated from a sealing material such as an epoxy or an epoxy mold compound (EMC), as well as other substances that are commonly known in the art for use as encapsulants.

In the fabrication methodologies of the first and second embodiments described above, subsequent to the formation of the mold cap 40 or the individual package bodies 46, a marking process may be carried out on portions of the mold cap 40 and the package bodies 46 to indicate information of option, maker, and the like on the completed chip packages 42, 48. After such marking, the singulation via saw and chemical etching or chemical etching alone is preferably completed. The etching method through the use of an etching solution may be carried out in a manner wherein the leadframe strip 10 including the formed package bodies 44, 46 is dipped in a bath filled with the etching solution, or through the spraying of the etching solution upon the connecting bars 29 through the use of a spray nozzle. In both the first and second embodiments of the present invention, the chemical etching of the metallic second layer 30 of the leadframe strip 10 to separate the leadframes 18 from each other, in addition to eliminating burr formation, minimizes or eliminates the physical impact of the saw blade against the metallic second layer 32, thus reducing susceptibility for "chip-out" or "die crack" of the die 34. As will be recognized, such impact is eliminated in the second embodiment of the present invention where no sawing process at all takes place.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A method of fabricating a semiconductor package, comprising the steps of:
   a) providing a lead frame strip defining a multiplicity of lead frames which each include:
      an outer frame defining a central opening;
      a die pad disposed within the central opening; and
      a plurality of leads attached to the outer frame and extending toward the die pad in spaced relation to each other;
      the outer frames being integrally connected to each other and collectively defining connecting bars which extend in multiple rows and columns and define saw streets;
   b) attaching semiconductor dies to respective ones of the die pads;
   c) mechanically and electrically connecting the semiconductor dies to the leads of respective ones of the lead frames;
   d) applying an encapsulant material to the lead frame strip to form a mold cap which at least partially encapsulates the lead frames, the semiconductor dies, and the conductive wires;
   e) sawing the mold cap along the saw streets to expose the connecting bars; and
   f) etching the connecting bars to separate the lead frames from each other.

2. The method of claim 1 wherein:
   step (a) comprises providing a lead frame strip which includes a layer of thermal tape applied to one side thereof;
   step (d) comprises applying the encapsulant material to a side of the lead frame strip opposite that including the layer of thermal tape applied thereto; and
   step (f) comprises etching the connecting bars to the layer of thermal tape.

3. The method of claim 2 further comprising the step of:
   (g) removing the layer of thermal tape from the lead frames.

4. The method of claim 1 wherein step (b) comprises bonding the semiconductor dies to respective ones of the die pads.

5. The method of claim 1 wherein step (c) comprises mechanically and electrically connecting the semiconductor dies to the leads of respective ones of the lead frames via conductive wires.

6. A method of singulating semiconductor packages from a lead frame strip which includes a mold cap applied to one side thereof and defines a multiplicity of lead frames integrally connected to each other by connecting bars which extend in multiple rows and columns and define saw streets, the method comprising the steps of:
   a) sawing the mold cap along the saw streets to expose the connecting bars; and
   b) etching the connecting bars to separate the lead frames from each other.

7. The method of claim 6 wherein a layer of thermal tape is applied to a side of the lead frame strip opposite that including the mold cap applied thereto, and step (b) comprises etching the connecting bars to the layer of thermal tape.

8. The method of claim 7 further comprising the step of:
   c) removing the lead frames from the layer of thermal tape.

9. A method of fabricating a semiconductor package, comprising the steps of:
   a) providing a leadframe strip including a layer of thermal tape applied to one side thereof and a multiplicity of leadframes which each include:
      an outer frame defining a central opening;
      a die pad disposed within the central opening; and
      a plurality of leads attached to the outer frame and extending toward the die pad in spaced relation to each other;
      the outer frames being integrally connected to each other and collectively defining connecting bars which extend in multiple rows and columns and define saw streets;
   b) attaching semiconductor dies to respective ones of the die pads;
   c) mechanically and electrically connecting the semiconductor dies to the leads of respective ones of the leadframes;
   d) applying encapsulant material to a side of the leadframe strip opposite that including the layer of thermal tape applied thereto to form a plurality of package bodies which at least partially encapsulate respective ones of the leadframes, the semiconductor dies, and the conductive wires, the package bodies being formed such that the connecting bars are exposed therebetween; and e) etching the connecting bars to the layer of thermal tape to separate the leadframes from each other.

10. The method of claim 9 further comprising the step of:

f) removing the layer of thermal tape from the leadframes.

11. The method of claim 9 wherein step (b) comprises bonding the semiconductor dies to respective ones of the die pads.

12. The method of claim 9 wherein step (c) comprises mechanically and electrically connecting the semiconductor dies to the leads of respective ones of the leadframes via conductive wires.

13. A method of singulating semiconductor packages from a leadframe strip which includes a plurality of package bodies formed on one side thereof, a layer of thermal tape applied to a side opposite that including the package bodies formed thereon, and a multiplicity of leadframes integrally connected to each other by connecting bars which are exposed between the package bodies and extend in multiple rows and columns and define saw streets, the method comprising the step of:

a) etching the connecting bars to the layer of thermal tape to separate the leadframes from each other.

14. The method of claim 13 further comprising the step of:

b) removing the leadframes from the layer of thermal tape.

15. A method of fabricating a semiconductor package, comprising the steps of:

a) providing a lead frame strip defining a multiplicity of lead frames which each include:
   an outer frame defining a central opening; and
   a plurality of leads attached to the outer frame and extending into the central opening in spaced relation to each other;
   the outer frames being integrally connected to each other and collectively defining connecting bars which extend in multiple rows and columns and define saw streets;

b) electrically connecting semiconductor dies to the leads of respective ones of the lead frames;

c) applying an encapsulant material to the lead frame strip to form a mold cap which at least partially encapsulates the lead frames, the semiconductor dies, and the conductive wires;

d) sawing the mold cap along the saw streets to expose the connecting bars; and f) etching the connecting bars to separate the lead frames from each other.

16. A method of fabricating a semiconductor package, comprising the steps of:

a) providing a leadframe strip including a layer of thermal tape applied to one side thereof and a multiplicity of leadframes which each include:
   an outer frame defining a central opening; and
   a plurality of leads attached to the outer frame and extending into the central opening in spaced relation to each other;
   the outer frames being integrally connected to each other and collectively defining connecting bars which extend in multiple rows and columns and define saw streets;

b) electrically connecting semiconductor dies to the leads of respective ones of the leadframes;

c) applying encapsulant material to a side of the leadframe strip opposite that including the layer of thermal tape applied thereto to form a plurality of package bodies which at least partially encapsulate respective ones of the leadframes, the semiconductor dies, and the conductive wires, the package bodies being formed such that the connecting bars are exposed therebetween; and d) etching the connecting bars to the layer of thermal tape to separate the leadframes from each other.

* * * * *